United States Patent
Hu et al.

(10) Patent No.: US 11,152,905 B2
(45) Date of Patent: Oct. 19, 2021

(54) WIDEBAND AMPLIFIER CIRCUIT

(71) Applicant: Apple Inc., Cupertino, CA (US)

(72) Inventors: Song Hu, San Jose, CA (US); Sohrab Emami-Neyestanak, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 7 days.

(21) Appl. No.: 16/560,905

(22) Filed: Sep. 4, 2019

(65) Prior Publication Data

US 2021/0067117 A1 Mar. 4, 2021

(51) Int. Cl.
*H03F 3/45* (2006.01)
*H03F 3/72* (2006.01)
*H03F 1/02* (2006.01)
*H03F 1/26* (2006.01)
*H03F 3/19* (2006.01)

(52) U.S. Cl.
CPC ............ *H03F 3/72* (2013.01); *H03F 1/0277* (2013.01); *H03F 1/26* (2013.01); *H03F 3/19* (2013.01); *H03F 3/45071* (2013.01)

(58) Field of Classification Search
CPC ................ H03F 3/45; H03F 2200/534; H03F 2200/537; H03F 2200/541; H03F 2200/06; H03F 2200/09
USPC ................ 330/165, 188, 189, 190, 195, 301
See application file for complete search history.

(56) References Cited

U.S. PATENT DOCUMENTS

| | | | |
|---|---|---|---|
| 6,271,721 B1 * | 8/2001 | Trask | H03F 1/347 327/560 |
| 7,400,193 B2 | 7/2008 | Wyatt | |
| 9,281,119 B2 | 3/2016 | Ni et al. | |
| 2007/0188238 A1 | 8/2007 | Su et al. | |
| 2010/0259319 A1 | 10/2010 | Chan et al. | |

OTHER PUBLICATIONS

Li et al., "Gm-Boosted Common-Gate LNA and Differential Colpitts VCO/QVCO in 0.18-um CMOS," IEEE Journal of Solid-State Circuits, vol. 40, No. 12, Dec. 2005, pp. 2609-2619.
Zhuo et al., "A Capacitor Cross-Coupled Common-Gate Low-Noise Amplifier," IEEE Transactions on Circuits and Systems—II: Express Briefs, vol. 52, No. 12, Dec. 2005, pp. 875-879.
Chamas et al., "Analysis, Design, and X-Band Implementation of a Self-Biased Active Feedback Gm-Boosted common-Gate CMOS LNA," IEEE Transactions on Microwave Theory and Techniques, vol. 57, No. 3, Mar. 2009, pp. 542-551.
International Search Report and Written Opinion in PCT Appl. No. PCT/US2020/046698 dated Oct. 29, 2020, 14 pages.

(Continued)

*Primary Examiner* — Steven J Mottola
(74) *Attorney, Agent, or Firm* — Kowert, Hood, Munyon; Erik A. Heter

(57) ABSTRACT

An amplifier includes a first coil coupled to at least one input node. The amplifier further includes second and third coils. A first terminal of the second coil is coupled to a source terminal of a first transistor, while a second terminal of the second coil is coupled to a source terminal of a second transistor. A third coil includes first and second terminals coupled to gate terminals of the first and second transistors, respectively. Responsive to receiving an input signal, the first coil electromagnetically conveys the signal to the second and third coils.

20 Claims, 6 Drawing Sheets

(56) References Cited

OTHER PUBLICATIONS

Wei et al., "A 140 GHz, 4 dB Noise-Figure Low-Noise Amplifier Design with the Compensation of Parasitic Capacitance CGS," 2019 IEEE 62nd International Midwest Symposium on Circuits ad Systems, Aug. 4, 2019, pp. 299-302.

Mohan et al., "The design, modeling and optimization of on-chip inductor and transformer circuits," Jan. 1, 2000, Retrieved from the Internet: URL:http://www-smirc.stanford.edu/papers/0rals99s-mohan.pdf; pp. 42-49.

* cited by examiner

WIDEBAND AMPLIFIER CIRCUIT

BACKGROUND

Technical Field

This disclosure is directed to electronic circuits, and more particularly, to amplifier circuits.

Description of the Related Art

Wideband amplifiers are commonly used in electronic systems, such as communications systems. For example, wideband amplifiers can be implemented in transmitter circuits of wireless communications systems to amplify signals prior to transmission. Wideband amplifiers may be implemented in wireless receivers to amplify signals received via an antenna. Among the features of a wideband amplifier that makes them useful in communications and other types of systems is their ability to leverage a broad frequency spectrum.

One frequently used topology used in implementing wideband amplifiers is the common-gate topology. In a common-gate amplifier, the input is provided to the source of a transistor and the output is taken from the drain. In many common-gate amplifiers, the gate terminal is coupled directly to a ground terminal. Common-gate amplifiers provide broadband input impedance matching and are thus particularly suitable for wideband applications. In addition to providing good impedance matching, many embodiments of a common-gate amplifier offer good noise performance.

SUMMARY

An amplifier circuit is disclosed. In one embodiment, an amplifier includes a first coil coupled to at least one input node. The amplifier further includes second and third coils. A first terminal of the second coil is coupled to a source terminal of a first transistor, while a second terminal of the second coil is coupled to a source terminal of a second transistor. A third coil includes first and second terminals coupled to gate terminals of the first and second transistors, respectively. Responsive to receiving an input signal, the first coil electromagnetically conveys the signal to the second and third coils.

In one embodiment, the amplifier may receive a single-ended input signal and output a differential signal. In another embodiment, both the input and output signals may be differential signals. The inductor coils of the amplifier may be implemented on different layers of an integrated circuit die. For example, the first coil may be implemented on a first metal layer of an integrated circuit, the second coil on a second metal layer adjacent to the first, and the third coil on a third layer adjacent to the second.

BRIEF DESCRIPTION OF THE DRAWINGS

The following detailed description makes reference to the accompanying drawings, which are now briefly described.

Figure 1:
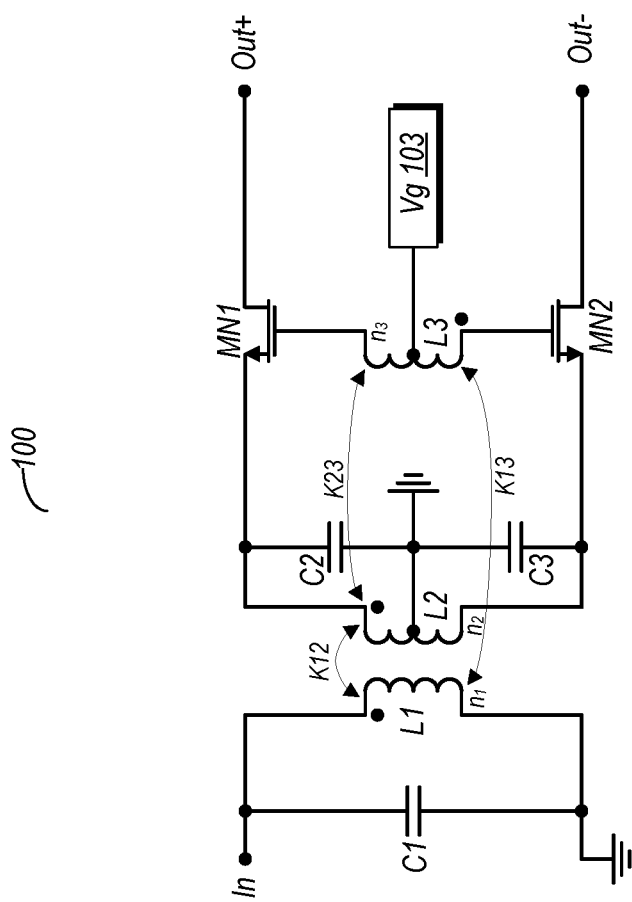
FIG. 1 is a schematic diagram of one embodiment of an amplifier circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Various embodiments of a wideband amplifier circuit are disclosed. Wideband, common-gate amplifiers are used in many wireless communications systems, among other application. Typical wideband amplifiers may achieve ultra-wideband input matching, but have difficulty addressing tightly coupled input matching and noise.

In a conventional $g_m$ (transconductance) boosted common-gate amplifiers, an active feed-forward path may be implemented. However, such embodiments may suffer from substantial noise due to the active feed-forward path, thereby degrading overall performance. To overcome the noise issue, $g_m$-boosted common gate amplifiers may implement a passive feed-forward path using a capacitor-coupled technique. However, these embodiments have gain issues, as the inverting gain is less than one, thereby limiting the performance. Furthermore, an additional balun (balanced-unbalanced) is needed, which can occupy significant circuit area. Conventional $g_m$-boosted common gate amplifiers that utilize a transformer coupled technique may also require an additional balun, which, in addition to consuming more area, can degrade amplifier gain and noise.

The wideband amplifier of the present disclosure overcomes these issues using a three-coil electromagnetic structure. A first one of the coils connects to the amplifier input, while second and third coils coupled to the source and gate terminals of common-gate transistors, respectively. The coils are electromagnetically coupled during operation. The coupling from the first coil to the second and third coils serve as first and second feed-forward paths, respectively. The second coil also includes a center tap coupled to a ground node, thereby providing a DC current path for the common-gate transistors. A center tap of the third coil (which is coupled to gate terminals of each of the common-gate transistors) is coupled to a voltage generation circuit that generates a DC bias voltage.

The arrangement of the disclosed wideband amplifier has a number of advantages not obtainable by the various conventional amplifiers described above. In the feed-forward path, the amount of introduced noise is marginal, and thus the amplifier is a low loss circuit. Second, the inverting gain in the feed-forward path can be easily adjusted by designing the turn ratio and the coupling of the three coils. Accordingly, the inverting gain can easily exceed one, thereby overcoming the limitations of the conventional capacitive feed-forward amplifiers discussed above. The feed-forward paths of the disclosed amplifier may be inherently broadband, which may ensure wideband power and noise reduction. Furthermore, since the first (input) coil of the amplifier can be arranged to accept either single-ended or differential signals, the balun function can thus be integrated into the three-coil electromagnetic structure. In contrast, the conventional amplifiers having passive feed-forward paths as discuss above can suffer penalties in area and signal loss due to single-ended to differential conversion. Generally speaking, the amplifier of the present disclosure may be implemented with a significantly simplified design while not suffering the drawbacks of the conventional implementations discussed above.

FIG. 1 is a schematic diagram of one embodiment of an amplifier circuit. In the embodiment shown, amplifier 100 is arranged to receive a single-ended input on an input terminal ('In') and produce a corresponding differential signal output on output terminals ('Out+' and 'Out−'). The input signal in the embodiment shown is provided to an input circuit including capacitor C1 and an inductor coil L1. The circuit also includes a second inductor coil, L2, and a third inductor coil, L3. First and second terminals of the inductor coil L2 are coupled to source terminals of transistors MN1 and MN2, respectively. First and second terminals of inductor coil L3 are coupled to gate terminals of MN1 and MN2, respectively. A center tap of inductor coil L2 is coupled to a ground node. Capacitors C2 and C3 are each coupled at one of their respective terminals to the ground, and coupled to the source terminals of MN1 and MN2, respectively. The arrangement of transistor MN1 and MN2 makes this embodiment a common-gate amplifier. The circuit also includes a voltage generation circuit 103, which is coupled to a center tap of inductor coil L3.

In the embodiment shown, a first magnetic coupling path (which can be referred to as a first feed forward path) exists between inductor coil L1 and inductor coil L2. Coils L1 and L2 have a magnetic coupling factor of K12, and a turn ratio of $n_1/n_2$. A second magnetic coupling (or alternatively, second feed forward) path exists between inductor coil L1 and inductor coil L3. Coils L1 and L3 have a magnetic coupling factor of K13 and a turn ratio of $n_1/n_3$. A third magnetic coupling (or third feed-forward) path exists between inductor coils L2 and L3, with a magnetic coupling factor of K23, with the coils having a turn ratio of $n_2/n_3$.

Voltage generation circuit 103 in the embodiment shown generates a DC bias voltage that is applied to the gates of transistors MN1 and MN2, which can be used to keep these transistors in an on state during operation of the amplifier.

Voltage generation circuit 103 may be implemented using any suitable circuitry, such as a bandgap circuit, that is capable of providing a stable DC output voltage. The DC current path from the source terminals of each of transistor MN1 and MN2, which depends at least in part on the DC bias voltage on their respective gate terminals, passes through inductor coil L2 to the center tap and to the correspondingly coupled ground node.

During operation of amplifier 100, the input signal is received by inductor coil L1 and transferred, electromagnetically, to inductor coils L2 and L3. Additionally, the signal across inductor coil L2 is electromagnetically conveyed to inductor coil L3. The voltages generated across L2 and L3 depend at least in part based on their respective turn ratios with L1, as well as the turn ratio between L2 and L3. Given the arrangement of transistors MN1 and MN2, the transistors operate in a push-pull manner. Furthermore, amplifier 100 as shown here is a non-inverting gain amplifier, and thus the output differential component on the Out+ terminal has a polarity the same as that of the input signal. In various embodiment, the gain, can be expressed as A, wherein A can be a value greater than one.

Figure 2:
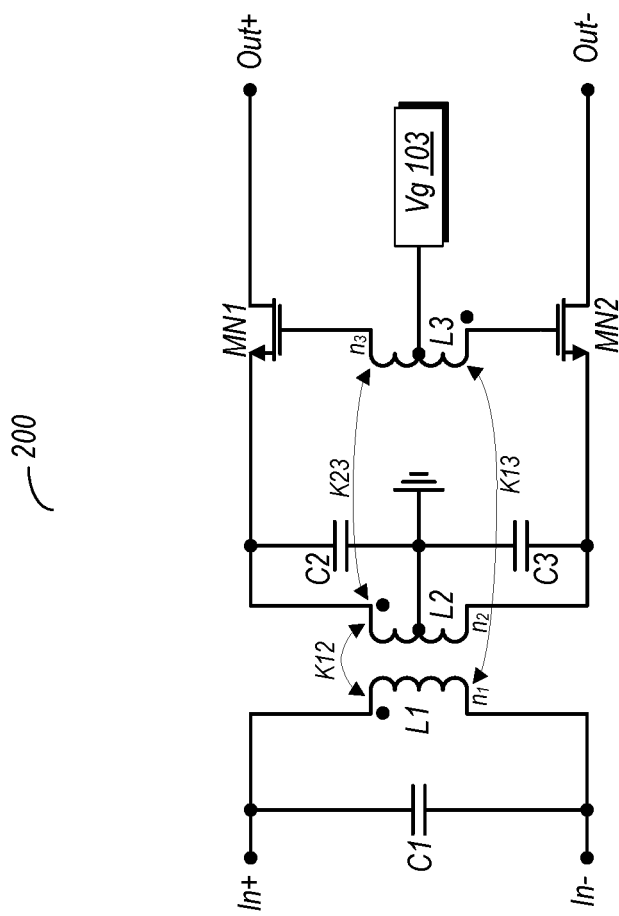
FIG. 2 is a schematic diagram of another embodiment of an amplifier circuit.

FIG. 2 is a schematic diagram of another embodiment of an amplifier circuit. Amplifier 200 in the embodiment shown is arranged in a manner that is largely similar to that of FIG. 1. However, in this particular embodiment, the input signal is a differential signal, received on input terminals In+ and In−. As with the previous embodiment, amplifier 200 provides non-inverting gain of A, and thus the output signal has a polarity the same as that of the input signal.

As noted above, the gain in the feed-forward paths of the amplifier embodiments of FIGS. 1 and 2 can be adjusted by setting the turn ratios and couplings of the corresponding inductor pairs. The voltage gain in the feed-forward paths in various embodiments is related to not only the turn ratios but also the magnetic coupling factors. For example, the voltage gain from L1 to L3 is $n3/n1*K13$ in the embodiment of FIGS. 1 and 2.

Figure 3:
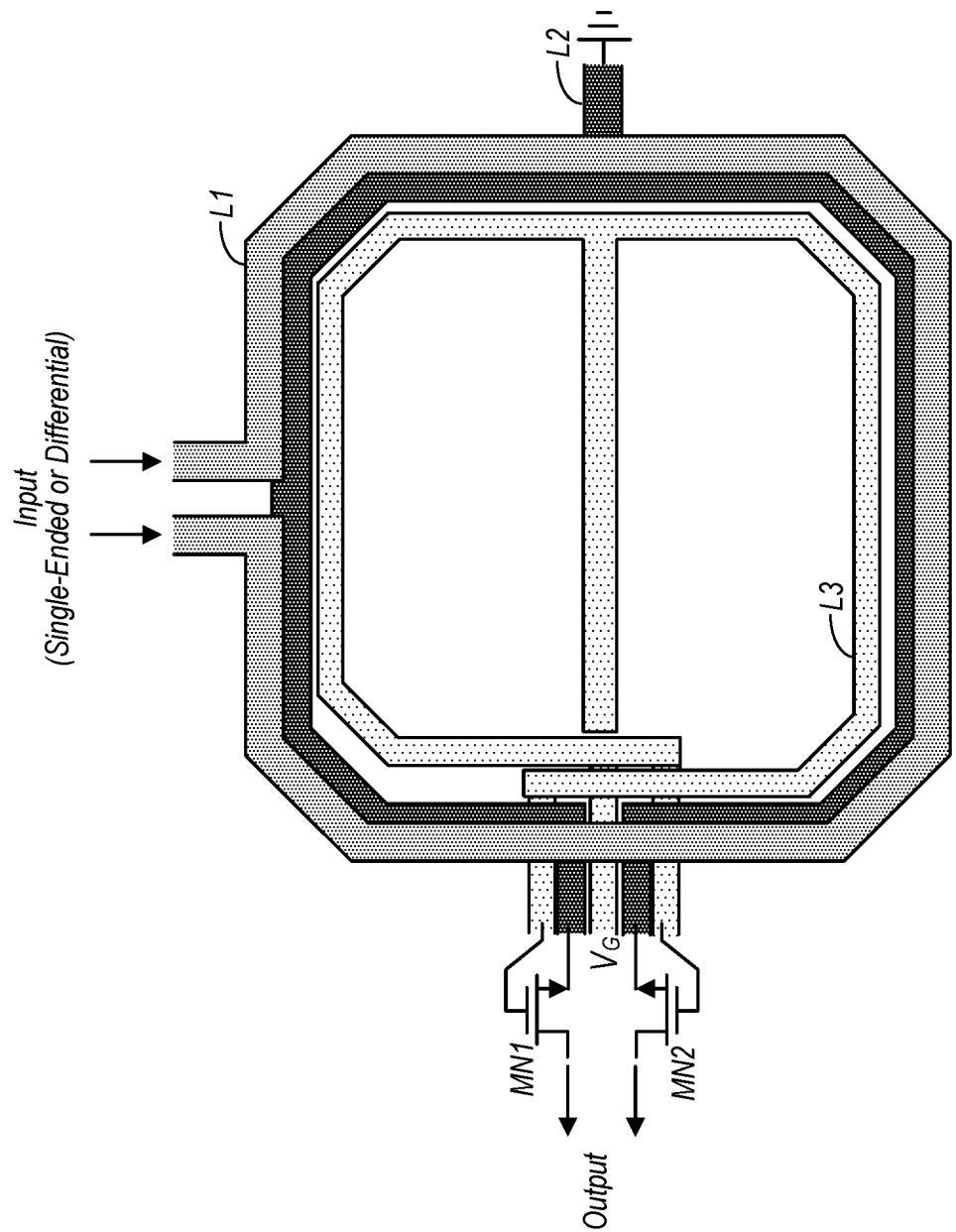
FIG. 3 is a diagram illustrating the implementation of inductor coils on an integrated circuit for one embodiment of an amplifier circuit.

FIG. 3 is a diagram illustrating the implementation of inductor coils on an integrated circuit for one embodiment of an amplifier circuit. More particularly, FIG. 3 shows the arrangement of the three inductor coils L1, L2, and L3 relative to one another as placed on an integrated circuit die.

In the embodiment shown, L1 is placed on a first metal layer of an integrated circuit die. This layer may be the top metal layer, although this is not necessarily a requirement per the scope of this disclosure. Inductor coil L2 in the embodiment shown is on a next metal layer adjacent to the first metal layer upon which L1 is implemented. Additionally, the source terminals of MN1 and MN2 are also connected to the second metal layer. On the third metal layer, which is adjacent to the second metal layer, inductor coil L3 is implemented, along with the respective gate terminals of MN1 and MN2, which are connected thereto.

Figure 4:
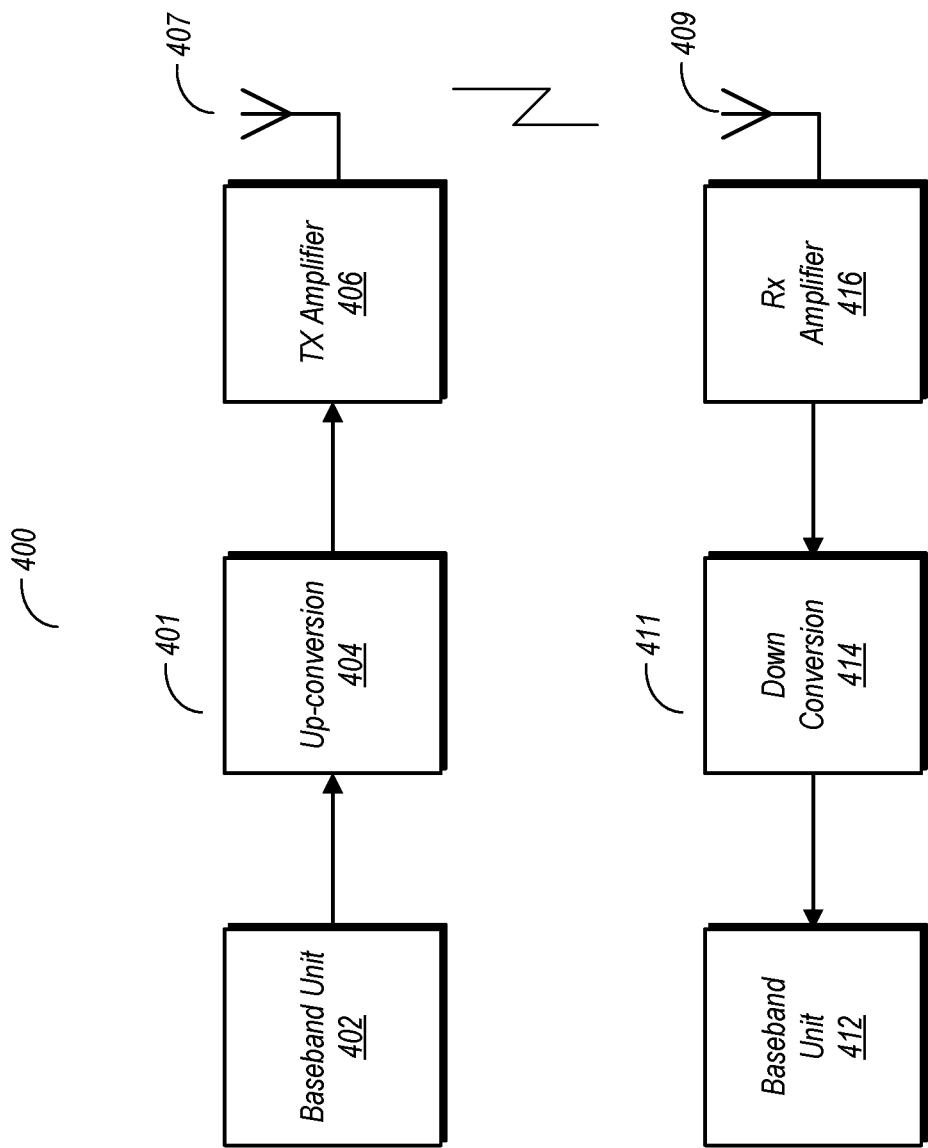
FIG. 4 is a block diagram of one embodiment of a wireless communication system.

FIG. 4 is a block diagram of one embodiment of a wireless communication system. Communication system 400 is illustrated here as an example application for various embodiments of the amplifier circuit discussed above. However, this example is not intended to be limiting, and thus various embodiments of the ultra-wideband amplifier circuit disclosed herein may be used in any suitable application.

In the embodiment shown, communication system 400 includes a transmitter chain 401 and a receiver chain 411. Transmitter chain 401 includes a baseband unit 402 in which information to be transmitted may be arranged according to a protocol of communication system 400 (e.g., into packets, frames, etc.). In some embodiments, the information to be transmitted may also be used to modulate a carrier signal. The output of baseband unit 402 is then provided to up-conversion circuitry 404. In up-conversion circuit 404, the carrier signal may be up-converted at least once to a higher frequency. In a direct conversion architecture, up-conversion circuit 404 converts the carrier signal directly to a radio frequency (RF). In a heterodyne architecture, up conversion circuit first converts the carrier to an intermediate frequency (IF) and then to the RF. In either case, up-conversion circuit may include one or more mixers and corresponding local oscillators to perform the conversion.

The final output from up-conversion circuit 404 is provided to transmitter amplifier 406. Transmitter amplifier 406 may be an embodiment of one of the amplifiers discussed above. The output from transmitter amplifier 406 is provided to an antenna 407, from which the signal is wirelessly transmitted.

Receiver chain includes an antenna 409 which may receive the wireless signal transmitted from transmitter chain 401. The wireless signal is then forwarded from antenna 409 to receiver amplifier 416, which may be a suitable one of the various amplifier circuit embodiments discussed above. The amplified signal output from receiver amplifier 416 is then forwarded to downconversion circuit 414, where it is down converted from the RF to a baseband carrier signal frequency. As with the transmitter, down conversion circuit 414 may implement a direct conversion architecture or a heterodyne architecture. Accordingly, down conversion circuit 414 may include one or more mixers and one or more local oscillators for performing the down conversion procedure. Thereafter, the output of down conversion circuit 414 is provided to baseband unit 412, wherein the signal may be demodulated to recover the transmitted information. This information may then be forwarded to other units within a system where the information may be used/consumed.

Figure 5:
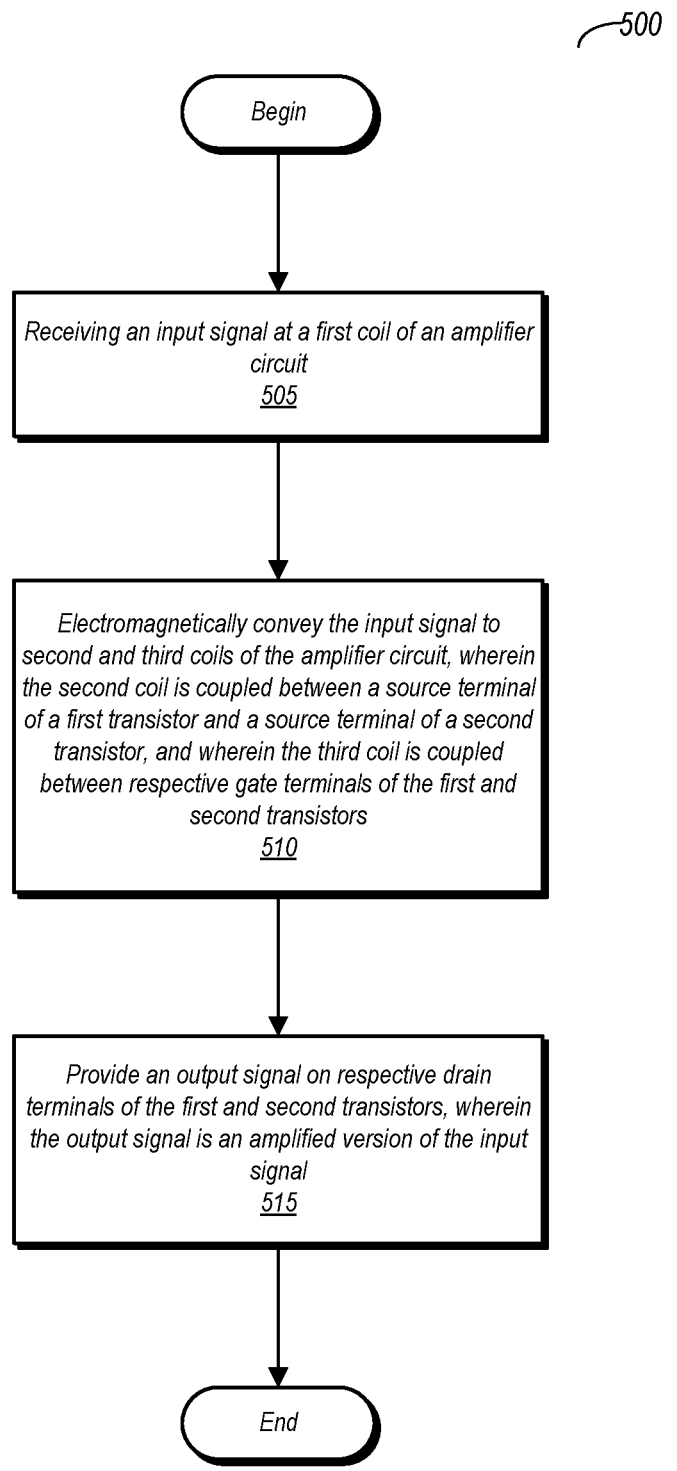
FIG. 5 is a flow diagram of one embodiment of a method for operating an amplifier circuit.

FIG. 5 is a flow diagram of one embodiment of a method for operating an amplifier circuit. Method 500 as shown here may be performed using various embodiments of an amplifier as discussed above in reference to FIGS. 1-4. Other amplifier embodiments not explicitly disclosed herein but capable of carrying out Method 500 may also fall within the scope of this disclosure.

Method 500 begins with receiving an input signal on a first coil of an amplifier circuit (block 505). The method further includes electromagnetically conveying the input signal to second and third coils of the amplifier circuit, wherein the second coil is coupled between a source terminal of a first transistor and a source terminal of a second transistor, and wherein the third coil is coupled between respective gate terminals of the first and second transistors (block 510). In various embodiment, the first and second transistors are arranged in a common-gate configuration, and thus implement a common-gate amplifier circuit. The method also includes providing an output signal on respective drain terminals of the first and second transistors, wherein the output signal is an amplified version of the input signal (block 515).

In one embodiment, receiving the input signal comprises receiving a single-ended signal, and wherein providing the output signal comprises providing a differential signal. In an alternate embodiment, receiving the input signal comprises receiving a first differential signal, and wherein providing the output signal comprises providing a second differential signal. Various embodiments also include a voltage generation circuit providing a DC bias voltage to a center tap of the third coil. In one embodiment, the amplifier circuit may be a non-inverting amplifier, and thus the method may include the amplifier circuit providing the output signal at the same polarity with respect to the input circuit.

Figure 6:
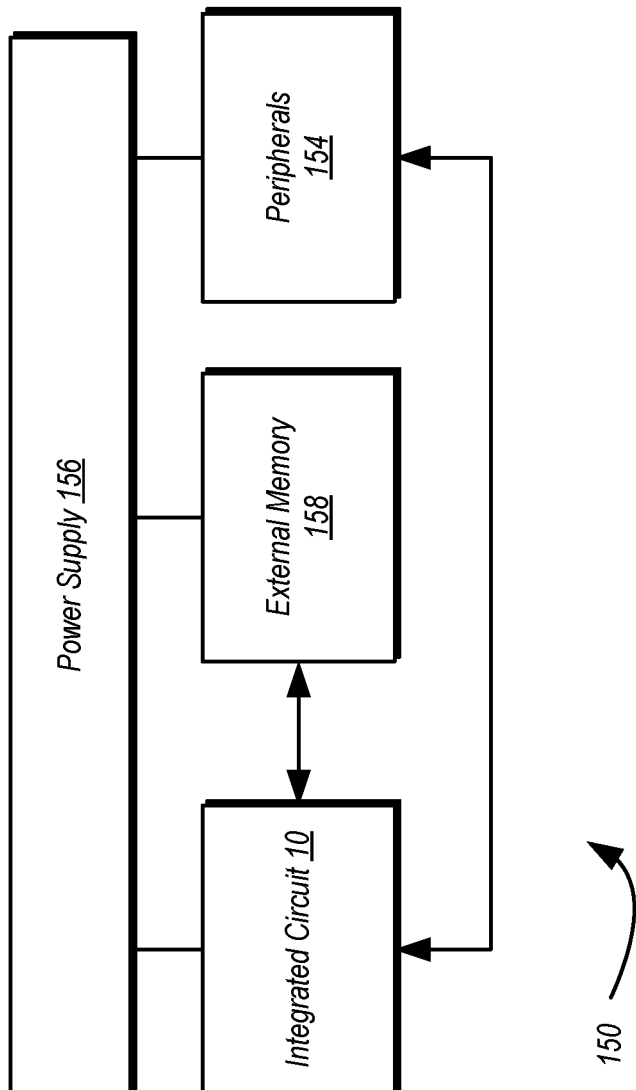
FIG. 6 a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments of system 150, one or more instances of a power amplifier such as that discussed above may be implemented on, e.g., integrated circuit 10 or on another integrated circuit that is part of peripherals 154. For example, peripherals 154 may include a wireless transmitter and a wireless receiver, each of which may include an amplifier as disclosed herein.

Numerous variations and modifications will become apparent to those skilled in the art once the above disclosure is fully appreciated. It is intended that the following claims be interpreted to embrace all such variations and modifications.

What is claimed is:

1. A circuit comprising:
a first coil coupled to an input node;
first and second transistors;
a second coil having a first terminal coupled to a source terminal of the first transistor, and a second terminal coupled to a source terminal of the second transistor;
a first capacitor coupled between a ground node and the first terminal of the second coil, and a second capacitor coupled between the ground node and the second terminal of the second coil; and
a third coil having a first terminal coupled to a gate terminal of the first transistor, a second terminal coupled to a gate terminal of the second transistor;
wherein, responsive to receiving an input signal, the first coil is configured to be electromagnetically convey the input signal to the second and third coils.

2. The circuit of claim 1, further comprising a reference voltage generator circuit, wherein the reference voltage generator circuit is coupled to a center tap of the third coil.

3. The circuit of claim 1, wherein the second coil further includes a center tap coupled to a ground node.

4. The circuit of claim 1, further comprising a third capacitor coupled between first and second terminals of the first coil.

5. The circuit of claim 1, wherein the circuit comprises a common-gate amplifier configured to receive a single-ended input signal and provide a differential output signal.

6. The circuit of claim 1, wherein the circuit comprises a common-gate amplifier configured to receive a differential input signal and provide a differential output signal.

7. The circuit of claim 1, wherein the circuit comprises a non-inverting gain amplifier.

8. The circuit of claim 1, wherein the first coil is implemented on a first metal layer of an integrated circuit die, wherein the second coil is implemented on a second metal layer of the integrated circuit die, and wherein the third coil is implemented on a third metal layer of the integrated circuit die.

9. The circuit of claim 8, wherein respective source terminals of the first and second transistors are second metal layer of the integrated circuit die, and wherein gate terminal of the first and second transistors are coupled to the third metal layer of the integrated circuit die.

10. A method comprising:
receiving an input signal at a first coil of an amplifier circuit;
electromagnetically conveying the input signal to second and third coils of the amplifier circuit, wherein the second coil is coupled between a source terminal of a first transistor and a source terminal of a second transistor, the source terminals of the first and second transistors being capacitively coupled to ground by first and second capacitors, respectively, and wherein the third coil is coupled between respective gate terminals of the first and second transistors; and
providing an output signal on respective drain terminals of the first and second transistors, wherein the output signal is an amplified version of the input signal.

11. The method of claim 10, wherein receiving the input signal comprises receiving a single-ended signal, and wherein providing the output signal comprises providing a differential signal.

12. The method of claim 10, wherein receiving the input signal comprises receiving a first differential signal, and wherein providing the output signal comprises providing a second differential signal.

13. The method of claim 10, further comprising a voltage generation circuit providing a DC bias voltage to a center tap of the third coil.

14. The method of claim 10, further comprising the amplifier circuit providing the output signal at the same polarity with respect to an input signal provided to an input circuit.

15. An integrated circuit comprising:
an amplifier circuit including:
a first coil implemented on a first metal layer;
a second coil implemented on a second metal layer;
a first capacitor coupled between a ground node and a first terminal of the second coil;

a second capacitor coupled between the ground node and the second terminal of the second coil;

a third coil implemented on a third metal layer;

a first transistor having a gate terminal coupled to the third coil, a source terminal coupled to the second coil, and a drain terminal coupled to a first output node; and a second transistor having a gate terminal coupled to the third coil, a source terminal coupled to the second coil, and a drain terminal coupled to a second output node;

wherein responsive to receiving an input signal, the first coil is configured to electromagnetically convey the input signal to the second and third coils.

16. The integrated circuit as recited in claim 15, wherein the amplifier circuit is configured to provide a differential output signal on the first and second output nodes.

17. The integrated circuit as recited in claim 15, wherein the amplifier circuit is configured to receive a single-ended input signal and provide a differential output signal.

18. The integrated circuit as recited in claim 15, wherein the amplifier circuit is configured to receive a differential input signal and provide a differential output signal.

19. The integrated circuit as recited in claim 15, wherein the amplifier circuit further includes a voltage generation circuit configured to provide a DC bias voltage on a center tap of the third coil.

20. The integrated circuit as recited in claim 15, wherein the amplifier circuit is coupled between an upconversion circuit and antenna, wherein the amplifier circuit is configured to amplify and transmit, via the antenna, a radio frequency signal received from the upconversion circuit.

* * * * *